United States Patent [19]

Shimizu

[11] Patent Number: 4,897,565
[45] Date of Patent: Jan. 30, 1990

[54] LOGIC CIRCUIT USING SCHOTTKY BARRIER FETS

[75] Inventor: Shoichi Shimizu, Fujisawa, Japan

[73] Assignee: Kabushiki Kaisha Toshiba, Kawasaki, Japan

[21] Appl. No.: 249,989

[22] Filed: Sep. 27, 1988

[30] Foreign Application Priority Data

Sep. 29, 1987 [JP] Japan .................................. 62-244588
May 13, 1988 [JP] Japan .................................. 63-116422

[51] Int. Cl.$^4$ ................. H03K 19/094; H03K 19/003; H03K 17/16; H03K 17/687
[52] U.S. Cl. ..................................... 307/448; 307/450; 307/475
[58] Field of Search ............... 307/443, 448, 450, 473, 307/475, 571, 581, 584, 296.1

[56] References Cited

U.S. PATENT DOCUMENTS

| | | | |
|---|---|---|---|
| 4,491,749 | 1/1985 | Iwamura | 307/473 |
| 4,712,023 | 12/1987 | Otsuki et al. | 307/448 X |
| 4,757,214 | 7/1988 | Kobayashi | 307/448 X |
| 4,800,303 | 1/1989 | Graham et al. | 307/448 X |
| 4,810,905 | 3/1989 | Graham et al. | 307/448 |
| 4,810,969 | 3/1989 | Fulkerson | 307/448 |
| 4,812,676 | 3/1989 | Yang et al. | 307/448 X |

Primary Examiner—John S. Heyman
Assistant Examiner—David R. Bertelson
Attorney, Agent, or Firm—Oblon, Spivak, McClelland, Maier & Neustadt

[57] ABSTRACT

Disclosed is a logic circuit using Schottky barrier FETs comprising a plurality of circuits connected in series between first and second power supply terminals, the plurality of circuits being DCFL and/or SCFL circuits, the DCFL circuit containing a switching element and a load element, the elements being connected in a direct fashion, and consisting of Schottky barrier FETs, the SCFL circuit being a logic unit containing Schottky barrier FETs connected in a differential fashion, and a potential stabilizing means for stabilizing a potential at the junction point between the adjacent circuits, by supplementally feeding the differential current between the current consumed by the adjacent circuits.

12 Claims, 13 Drawing Sheets

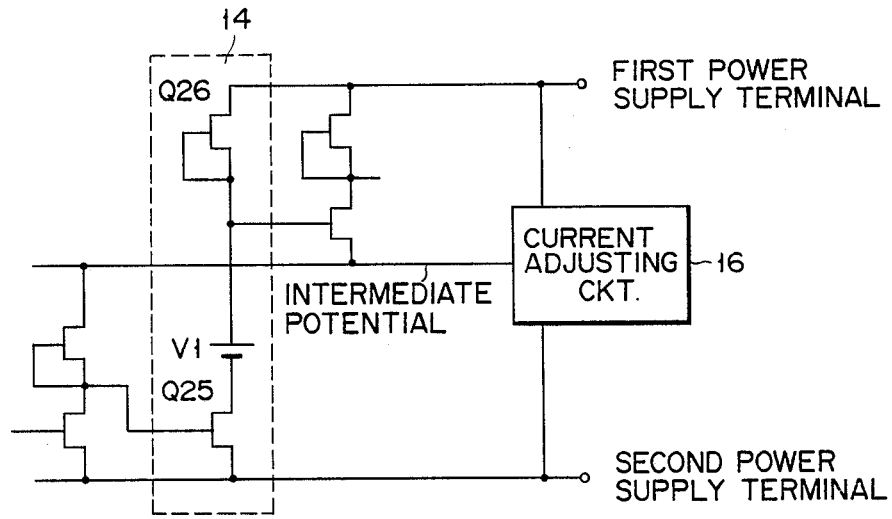
F I G. 6
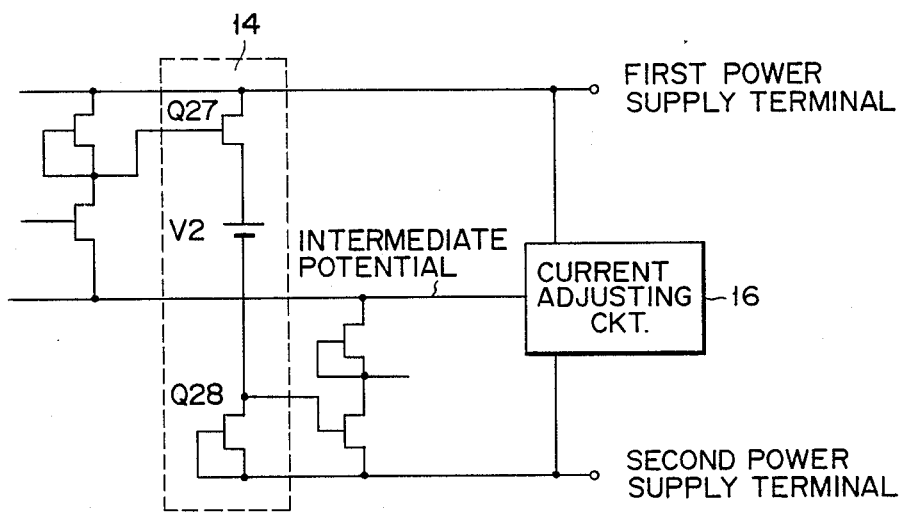
F I G. 7

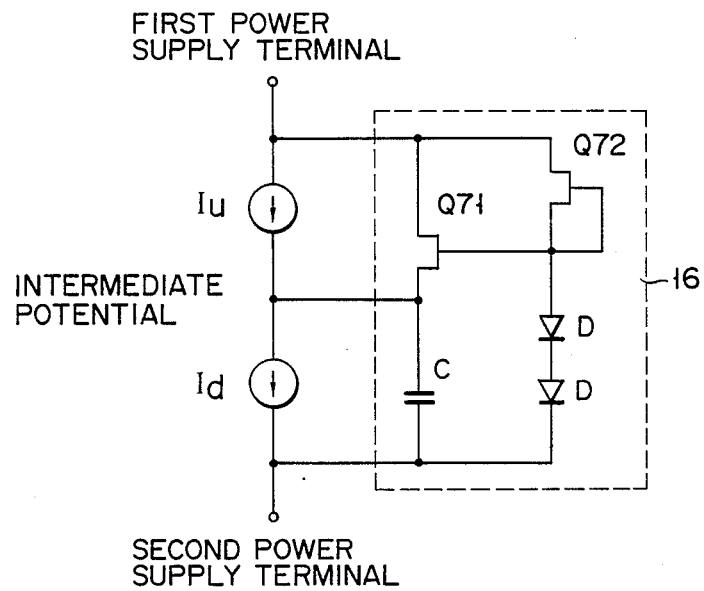
FIG. 15
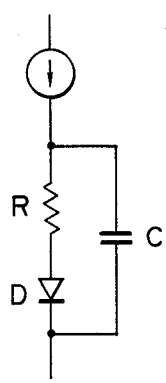      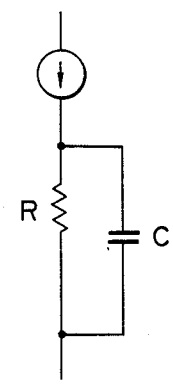      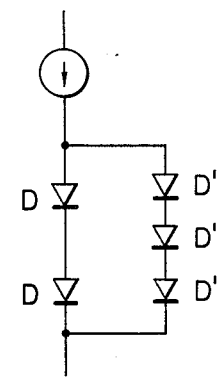
FIG. 16A    FIG. 16B    FIG. 16C

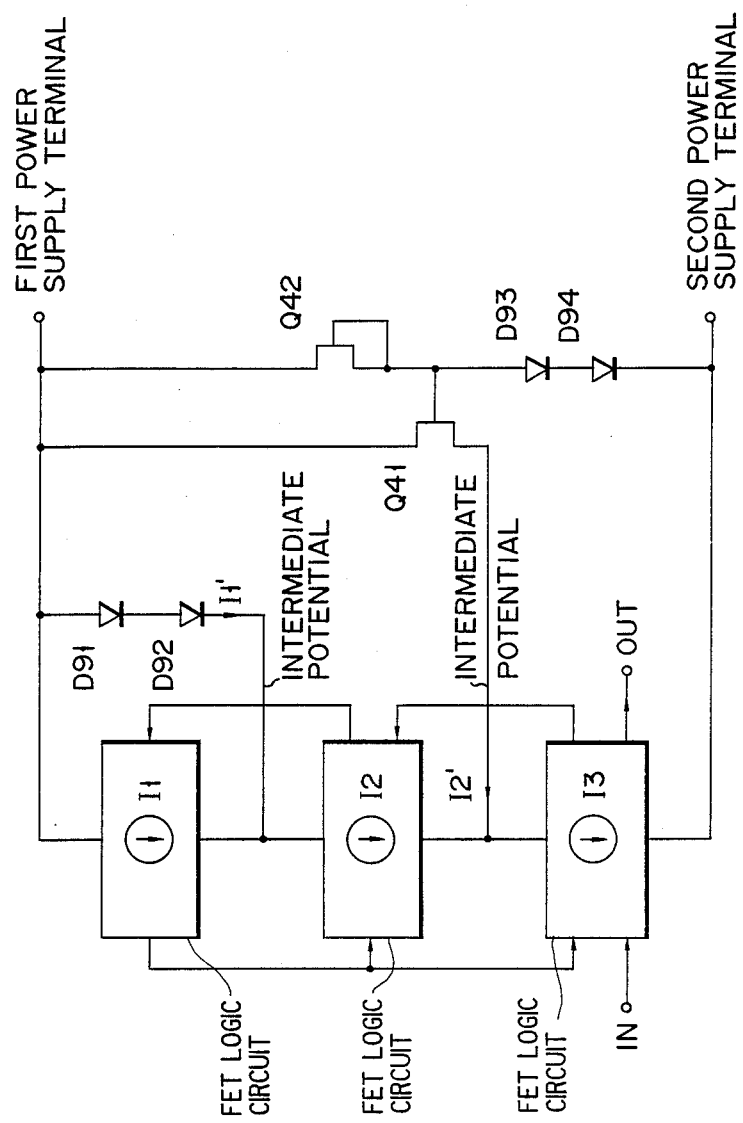
F I G. 17

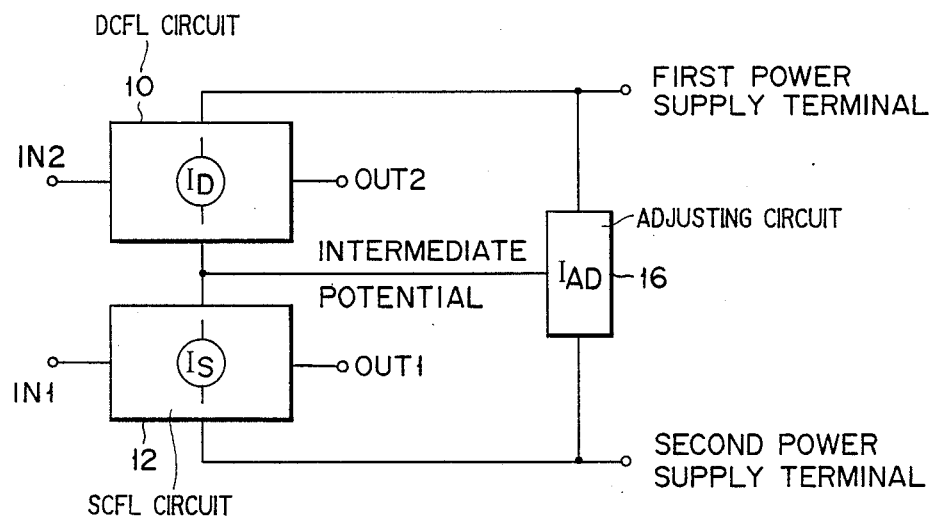
F I G. 20

LOGIC CIRCUIT USING SCHOTTKY BARRIER FETS

BACKGROUND OF THE INVENTION

1. Field of the Invention

This invention relates to a logic circuit using Schottky barrier FETs.

2. Description of the Related Art

The electron mobility of GaAs is several times that of silicon. A logic circuit constructed using GaAs is suitable for a high speed logic processing. The elements made of GaAs have received considerable attention because of their nature that the forward voltage necessary for the logic drive is low, and hence the power dissipation is small. This impels the development of the logic ICs constructed with Schottky barrier FETs.

The logic circuit consisting of GaAs Schottky barrier FETs comes in two varieties, the DCFL (direct coupled FET logic) and the SCFL (source coupled FET logic). The DCFL is made up of a switching element and a load element, both elements being constructed with Schottky barrier FETs. The logic output is derived from the junction point between them. The SCFL is of the current switching type in which a couple of Schottky barrier FETs are differentially connected with each other. One of the attractive features of this type of the logic ICs may be driven usually by approximately 1 V or 2 V.

It is a rare case that a logic system is constructed by using only the logic ICs based on the GaAs Schottky barrier FETs. Most of the logic systems are constructed by using both the GaAs ICs and the silicon ICs such as CMOS and ECL. The silicon based IC usually requires 3 to 5 V for its drive source. This indicates that such logic systems reject use of the same power voltage. One of the measures thus far taken for this is to divide the power voltage for the silicon ICs by resistors, for example, into a voltage suitable for driving the GaAs ICs. This measure, however, creates another problem of increased power dissipation, although it allows use of a single power source for these different types of ICs.

SUMMARY OF THE INVENTION

Accordingly, an object of this invention is to provide a logic circuit using GaAs Schottky barrier FETs which may substantially reduce the power dissipation of the overall logic system constructed by using the GaAs ICs and the silicon ICs.

According to one aspect of this invention there is provided a logic circuit using Schottky barrier FETs comprising:

a plurality of circuits connected in series between first and second power supply terminals, said plurality of circuits being DCFL and/or SCFL circuits, said DCFL circuit containing a switching element and a load element, said elements being connected in a direct fashion, and consisting of Schottky barrier FETs, said SCFL circuit being a logic unit containing Schottky barrier FETs connected in a differential fashion; and a potential stabilizing means for stabilizing a potential at the junction point between said adjacent circuits, by supplementally feeding the differential current between the current consumed by said adjacent circuits.

The logic circuit according to this invention further may comprise a transmitting means for transferring a logic signal from one of said circuits to another.

The stabilizing means may include
a circuit for generating a reference potential; and
a Schottky barrier FET coupled at the gate with said reference potential, and outputting as a source follower fashion, said FET being fabricated by the same process as that of a current-source Schottky barrier FET of the circuit utilizing the potential at said junction point.

The logic circuit of this invention may further comprise an output circuit made up of two Schottky barrier FETs connected in series between said first and second power supply terminals, the gates of said two FETs receiving logic signals one having the inverse logic of the other, the junction point of said two FETs providing a logic signal amounting to the potential difference between said first and second power supply terminals.

The logic circuit of this invention connects the DCFL and/or SCFL circuits in series between the first and second power supply terminals, with an intention to reduce power dissipation.

The DCFL circuit consisting of a unit logic including a switching element and a load element, these elements being Schottky barrier FETs is operable at a low potential of about 1 V. The SCFL circuit consisting of a unit logic including Schottky barrier FETs connected in a differential fashion, is operable at a low potential of about 2 V. The currents flowing through these circuits are almost invariable irrespective of changing logic states of the circuits when these circuits is operating. If by making use of the constancy of the currents, a plurality of floors of these circuits, for example, two or three floors, are connected in series between the first and second power supply terminals, the resultant circuit may directly be connected to the power supply for the silicon IC. With such an arrangement, there is no need for reducing the power voltage by using the resistor, for example, up to the voltage available for the GaAs IC. If the number of connected floors is "n", the power dissipation is reduced 1/n at most.

As described above, the currents consumed by the DCFL and SCFL circuits are invariable throughout the logic operation of the circuits. Hence, if a plurality of floors of these circuits are connected in series, the differential current between the adjacent floors is also constant irrespective of the logic states of the circuits. On the basis of the current constancy, a current adjusting means may be formed with a simple construction, to stabilize the potential (intermediate potential) at each junction point between the adjacent floors.

When the current adjusting means is constructed with a Schottky barrier FET source follower connected, the FET is preferably formed with the same structure as that of the current source FET of the DCFL or SCFL circuit, which utilizes the current adjusting means. These FETs are formed by the same process, for example, these are formed on the same wafer in the same process steps. If so, the resultant FETs have same variances in the threshold values, for example. Cancelling out of those variances provides a stable intermediate potential.

When a logic system is assembled by using the logic circuits of the present invention and the silicon IC, it is frequently required that a logic signal is transferred from the logic circuit to the silicon IC with a high logic potential. In such a case, use of the output circuit allows a logic potential to be swung between the power supply potential and the reference potential, and therefore, enables such a logic transfer.

BRIEF DESCRIPTION OF THE DRAWINGS

Other objects and features of this invention will be apparent from the following description in conjunction with the accompanying drawings, in which:

FIGS. 6 to 9 show circuit diagrams of embodiments of a logic signal transfer circuit according to this invention;

FIG. 15 shows a circuit diagram of a current adjusting circuit based on the source follower connection;

FIGS. 16A through 16C show circuit diagrams for generating a reference potential in the FIG. 15 circuit;

FIG. 17 shows a circuit diagram of a logic circuit containing three floors of DCFL or SCFL circuits;

FIG. 20 shows a circuit diagram of a logic circuit according to an additional embodiment of this invention.

DETAILED DESCRIPTION OF THE PREFERRED EMBODIMENTS

Preferred embodiments of this invention will be described in detail referring to the accompanying drawings.

Figure 1:
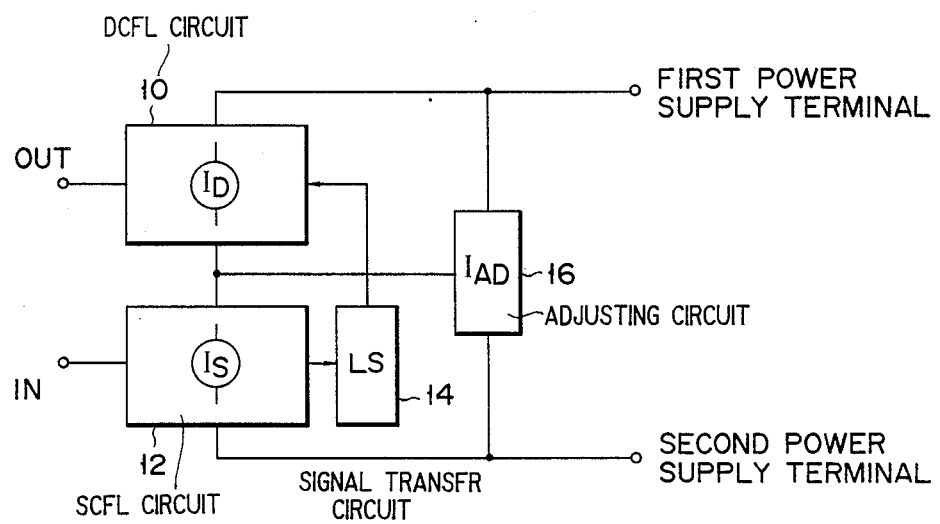
FIG. 1 shows a logic circuit according to a first embodiment of this invention in which DCFL and SCFL circuits are connected in series between first and second power supply terminals.

A first embodiment of a logic circuit according to this invention is configured as illustrated in FIG. 1. As shown, a logic circuit is made up of two types of logic circuits, DCFL and SCFL circuits denoted as 10 and 12. Two floors of DCFL 10 and SCFL 12 are successively connected between first and second power supply terminals. The second power supply terminal is for the reference potential. These power supply terminals are directly connected to the silicon IC. Signal transfer circuit 14, further provided, transfers a logic signal from the lower floor SCFL 12 to the upper floor DCFL 10. Current adjusting circuit 16, additionally provided, applies an intermediate potential to the junction point between DCFL 10 and SCFL 12.

This current adjusting circuit 16 feeds to the junction point, a differential current between the current $I_D$ consumed by DCFL 10 and the current $I_S$ by SCFL 12, thereby to stabilize the intermediate potential.

In this embodiment, a logic input signal to be processed is applied to the input terminal IN of the lower floor SCFL 12, while the processed logic output is derived from the output terminal OUT of the upper floor DCFL 10. In the logic processing, the upper and lower floor logic circuits 10 and 12 cooperatively operate. The logic circuit with such an arrangement that these floors 10 and 12 of DCFL and SCFL are connected in series between the first and second power supply terminals as shown in FIG. 1, is capable of effecting the normal logic operation. The reason for why such a logic circuit can effect the normal logic operation is that the currents $I_D$ and $I_S$ are substantially invariable regardless of the logic states in the operating circuit, and hence the current $I_D$ may substantially be utilized as the current $I_S$. To the contrary, when these currents $I_D$ and $I_S$ greatly vary depending on the logic states, different power supplies must be used for the DCFL and SCFL floors, respectively. It is evident that the need for a plurality of different power supplies make it difficult to arrange a plurality of the circuit floors between the first and second power supplies. In other words, an effective logic circuit arrangement would be impossible.

The reason why currents $I_D$ and $I_S$ of DCFL 10 and SCFL 12 are substantially invariable regardless of the circuit logic states, will be discussed referring to FIGS. 2 to 5.

Figure 2:
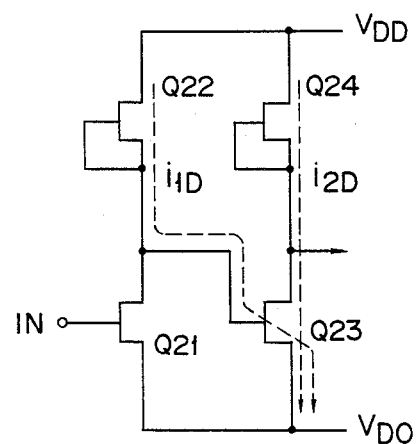
FIG. 2 shows a circuit diagram of a unit logic of the direct coupling type.

As shown in FIG. 2, DCFL 10 is made up of two unit logic circuits of the direct couple type. The first unit logic is made up of an enhancement mode Schottky barrier FET Q21 as a switching element and a depletion mode Schottky FET Q22 as a load element. The second unit logic likewise is made up of an enhancement mode Schottky barrier FET Q23 as a switching element and a depletion mode Schottky FET Q24 as a load element. A junction point between the drain of switching element Q21 and load element Q22 is connected to the gate of switching element Q23 of the next stage of the unit logic. In each unit logic, the logic output is the drain of switching element Q21 (Q23) coupled with load element Q22 (Q24). Further, each load element Q22 (Q24) is directly connected at the gate to its source, and consists of the depletion mode FET. Therefore, the load element serves as a constant current load.

In the unit logic circuit thus arranged, a high potential logic is applied to the gate IN of switching element Q21. In turn, it is turned on to allow load current i1D to flow through the channel of the element Q21. When the gate IN of switching element Q21 goes low in logic level, transistor Q21 becomes turned off, and the drain potential rises. In turn, the gate potential of switching element Q23 in the next stage of the unit logic, also rises. Element Q23 is also turned on to allow the load current i2D to flow to element Q23, from load element Q24. Switching elements Q21 and Q23 are both Schottky barrier FETs. Therefore, when the voltage at the gate of each switching element exceeds approximately 0.7 V, which is the forward voltage of a diode formed between the gate and source of that element, the forward current starts to flow from the gate to the source. In other words, when the drain voltage of switching element Q21 rises and reaches approximately 0.7 V, the load current i1D from load element Q22 flows as a gate current into the switching element Q23 in the next stage of the unit logic. This results in clamping the drain voltage at approximately 0.7 V. Two broken lines with arrow heads in FIG. 2 indicate the paths and the direction of the load currents i1D and i2D, which flow under this condition.

As can be seen from the foregoing, when considering only the first stage unit logic consisting of Q21 and Q22, the load current i1D is invariable irrespective of changing logic states in the operating logic circuit, but it flows through another path.

Figure 3:
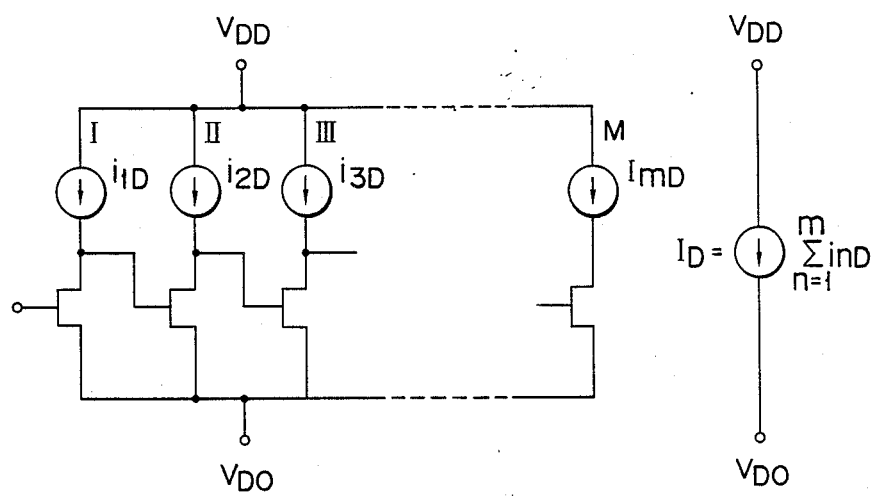
FIG. 3 shows a circuit diagram of a DCFL circuit using the FIG. 2 unit logics, and useful in explaining the current consumed by the circuit.

The DCFL circuit 10 in FIG. 2 is made up of two unit logics, and operates with the substantially invariable load current at all times. Amplifying this technical idea of such a logic circuit, we could reach another technical idea that the DCFL may be constructed with a further number of unit logics. This is implemented as shown in FIG. 3. Assuming that the number of unit logics is "m", and the current flowing through each unit logic is inD (n=1, ..., m), then the current $I_D$ flowing through the DCFL circuit is given by $$\sum_{n=1}^{m}$$

inD. The value of this current $I_D$ is invariable throughout the logic operation with changing logic states.

Figure 4:
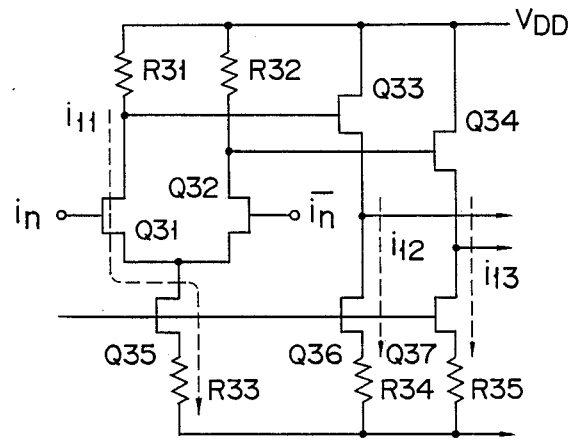
FIG. 4 shows a circuit diagram of a unit logic of the current switching type.

Turning now to FIG. 4, there is shown a unit logic of the current switching type, which makes up an SCFL circuit. A couple of Schottky barrier FETs Q31 and Q32 are interconnected at the sources. FETs Q31 and Q32 receive at the gates logics "in" and "$\overline{in}$", of which one is the inverted logic of the other. These FETs serve as switching elements, and respectively produce the logics which are related in the inverted manner. These logic signals are output from the drains connected to load resistors R31 and R32, through a differential operation. A Schottky barrier FET Q33 is connected in a source-follower fashion, with its gate connecting to the drain of FET Q31, and the source transferring the logic of FET Q31 to the next stage circuit. This FET serves as a buffer element. A Schottky barrier FET Q34 is connected in a source-follower fashion, with its gate connecting to the drain of FET Q32, and the source transferring the logic of FET Q32 to the next stage circuit. This FET serves also buffer element. Other elements Q35 to Q37 also consist of Schottky barrier FETs. FET Q35, together with resistor R33, serves as a current source for feeding small current i11 to the differential circuit including transistors Q31 and Q32. FET Q36, together with resistor R34, serves as a current source for feeding small current i12 to the buffer circuit as FET Q33. FET Q37, together with resistor R35, serves as a current source for feeding small current i13 to the buffer circuit of FET Q34. The current i11 of the differential circuit flows through either of the switching elements Q31 and Q32, according to the logic states at the gates "in" and "$\overline{in}$". The current i11 has a fixed value as defined by FET Q35 and resistor R33, irrespective of input logic states. The current i12 of the Q33 buffer is constant, and the current i13 of the Q34 buffer is constant. The current is of the unit logic, as the sum of these currents i11, i12 and i13, is constant irrespective of logic states.

Figure 5:
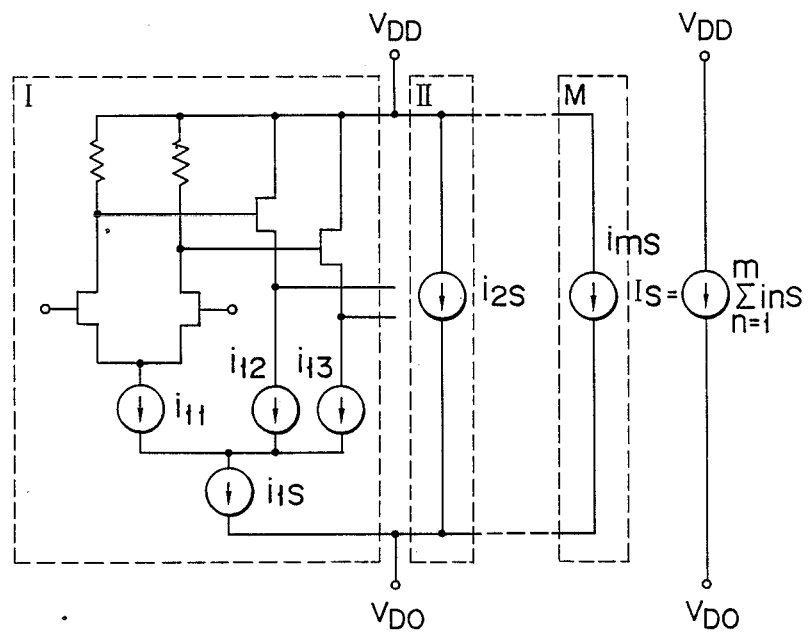
FIG. 5 shows a circuit diagram of a SCFL circuit using the FIG. 4 unit logics, and useful in explaining the current consumed by the circuit.

FIG. 5 shows another SCFL circuit, which is constructed by using a plurality of the unit logics of FIG. 4. The current Is of the SCFL circuit is given by $$\sum_{n=1}^{m}$$

ins ("m" the number of unit logics, and "ins" the current of each unit logic), and is invariable throughout the logic operation.

As described above, the constant currents flow through the DCFL and SCFL circuit 10 and 12, irrespective of the logic states in the operating logic circuit. Therefore, the logic circuit consisting of different types circuits, even when these different types of logic circuits are connected in in series between first and second power supply terminals, can be operated stably by merely feeding the differential current between those constant currents to the circuit system by means of current adjusting circuit 16.

In the first embodiment of this invention as mentioned above, SCFL circuit floor 12 is followed by DCFL circuit stage 10. If necessary, these may be reversed in order or both the upper and lower floors may be constructed by using only the same type of circuits, for example, the DCFL or SCFL circuits. Further, a further number of these floors may be used between the first and second power supply terminals.

To operate the logic circuit consisting of a plurality of circuit floors connected in series between the first and second power supplies, the logic signal must smoothly be transferred between or among those serially connected floors. To this end, a logic signal transfer means is needed. Some specific examples of signal transfer circuits 14 are illustrated in FIGS. 6 to 9. These circuits will be described in detail.

A circuit arrangement shown in FIG. 6 contains two serially connected circuits both being of the DCFL type. A logic signal is transferred from the lower floor circuit to the upper circuit. In this logic circuit, a logic signal transfer circuit 14 is shown enclosed by a rectangle of broken line. Logic transfer circuit 14 is made up of two FET elements Q25 and Q26, which are Schottky barrier FETs. FET Q25 serves as a switching element, like the switching element of the unit logic circuit as early described. The gate of FET Q25 is coupled for reception with the logic output of the DCFL circuit of the lower floor. The source of this FET is connected to the second power supply terminal as the lower potential terminal for the lower stage. The drain of FET Q25 is connected to the source of Q26 as a load element, through a level shift means V1 as a measure for the voltage difference between the lower and upper floor circuits. The drain of FET Q26 is connected to the first power supply terminal as a high potential power supply terminal for the upper floor circuit. The gate of FET Q26 is connected to its source. The FET Q26 thus arranged serves as a constant current load, like the load element of the unit logic. The source potential of FET Q25 is level shifted, and the level shifted potential is applied as a logic input to the upper floor DCFL circuit. The level shift means may be formed by utilizing any of the forward voltage of a diode, a constant voltage diode characteristic, Schottky barrier FET's characteristic, and other constant voltage characteristics.

A circuit arrangement shown in FIG. 7 uses another logic signal transfer circuit 14. In this instance, the circuit 14 transfers the logic from the upper floor DCFL circuit to the lower floor DCFL circuit. As shown, switching element Q27 is connected at the gate to the logic output of the upper floor circuit, and at the drain to the first power supply terminal as a high potential power supply terminal. The source of FET Q27 is connected to the drain of load element Q28 via level shift means V2 like that of the FIG. 6 instance. The FET Q27 is used with the source follower connection. The gate and source of FET Q28 are both connected to a second power supply terminal as a low potential power supply terminal for the lower floor DCFL circuit. The FET Q28 thus connected serves as a constant current load. The potential at the source of FET Q27 is dropped in level by level shift means V2, and is applied as a logic input to the lower floor DCFL circuit.

Figure 8:
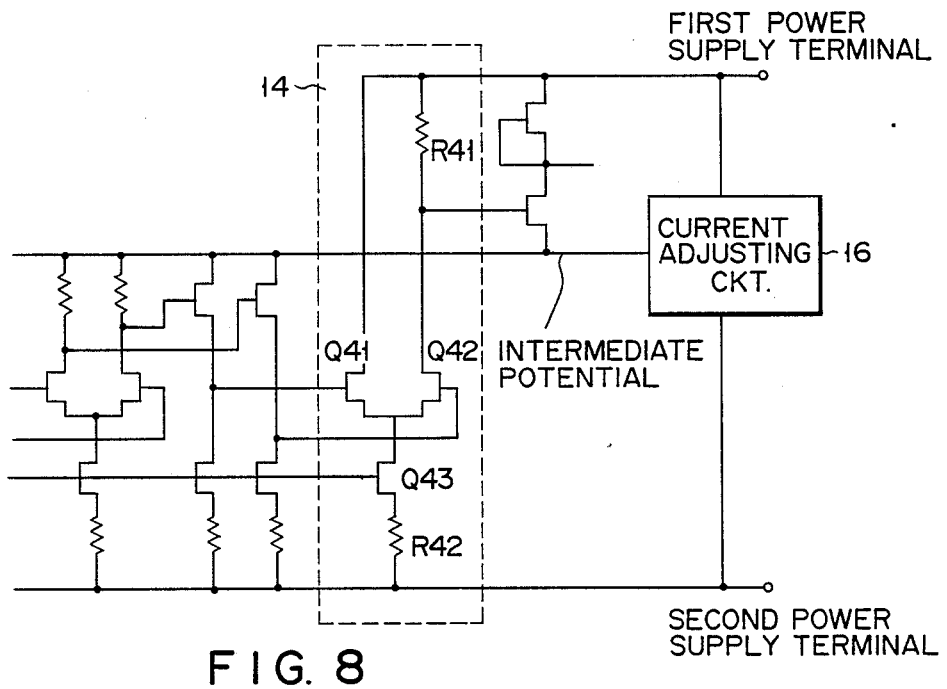

Yet another instance of the logic signal transfer circuit 14 is assembled into a logic circuit, as shown in FIG. 8 in which a logic signal is transferred from the lower floor circuit of the SCFL type to the upper floor circuit of the DCFL type. The signal transfer circuit 14 enclosed by a rectangle of broken line is made up of Schottky barrier FETs Q41, Q42, and Q43, and resistor R42. This circuit is similar, in both the circuit arrangement and the operation, to the differential section in the SCFL type unit logic of FIG. 4. The drain of FET Q41 is directly connected to the first power supply terminal as a high potential power supply terminal for the upper floor DCFL circuit. The drain of FET Q42 is connected through load resistor Q41 to the same. The potential level shifted by signal transfer circuit 14 is derived from the drain of FET Q42, and supplied to the upper floor DCFL circuit.

Figure 9:
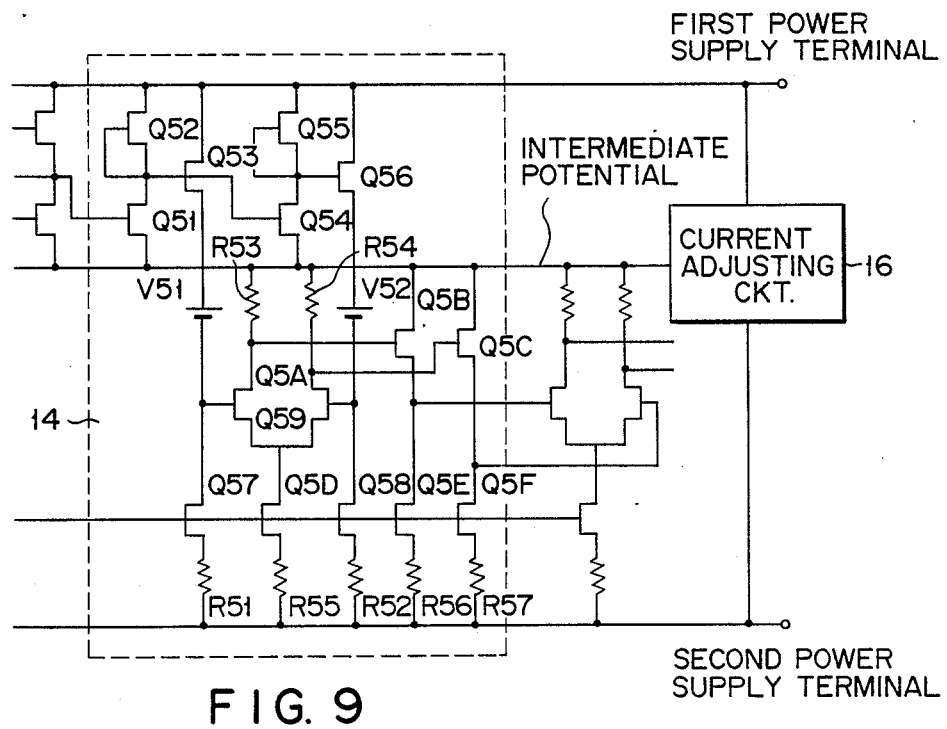

A further logic signal transfer circuit 14 is found in a logic circuit shown in FIG. 9 in which a logic signal is transferred from the upper floor DCFL circuit to the lower floor SCFL circuit. In the logic circuit, a couple of Schottky barrier FETs Q51 and Q52, and another couple of Schottky barrier FETs Q54 and Q55 each pair cooperatively form a unit logic circuits of the direct coupled type. The output signal of the unit logic circuit of Q51 and Q52 is the inverse logic level of the unit logic of Q54 and Q55. The logic output of the upper floor DCFL circuit is transferred to the lower floor SCFL circuit, through buffers respectively constructed with Schottky barrier FETs Q53 and Q56. These FETs Q53 and Q56 are connected in the source-follower fashion. The source of FET Q53 is connected to the second power supply terminal serving as a low potential power supply terminal for the lower floor circuit, through level shift means V51, and a constant current load consisting of Q57 and R51. The source of FET Q56 is connected to the second power supply terminal, through level shift means V52, and a constant current load consisting of Q58 and R52. FETs Q59, and Q5A to Q5F, and resistors R53 to R57 cooperate to form the current switching type unit logic circuit like that of FIG. 4. The gates of FETs Q59 and Q5A are respectively connected to the drains of FETs Q57 and Q58. The inputs of the current switching type unit logic are coupled for reception with the logic signals which come from the upper floor DCFL circuit after level shifted. These logic signals are logically inverted. The source potentials of FETs Q5B and Q5C are applied as logic inputs to the lower floor SCFL circuit. The level shift means V51 and V52 are substantially the same as that used in the instance of FIG. 6.

Signal transfer circuit 14 can be used not only as simply an interstage logical transfer means but also a logical processing circuits. The embodiments of FIGS. 10 and 11, each, are a circuit serving as both a logical processing means and logical transferring means.

Figure 10:
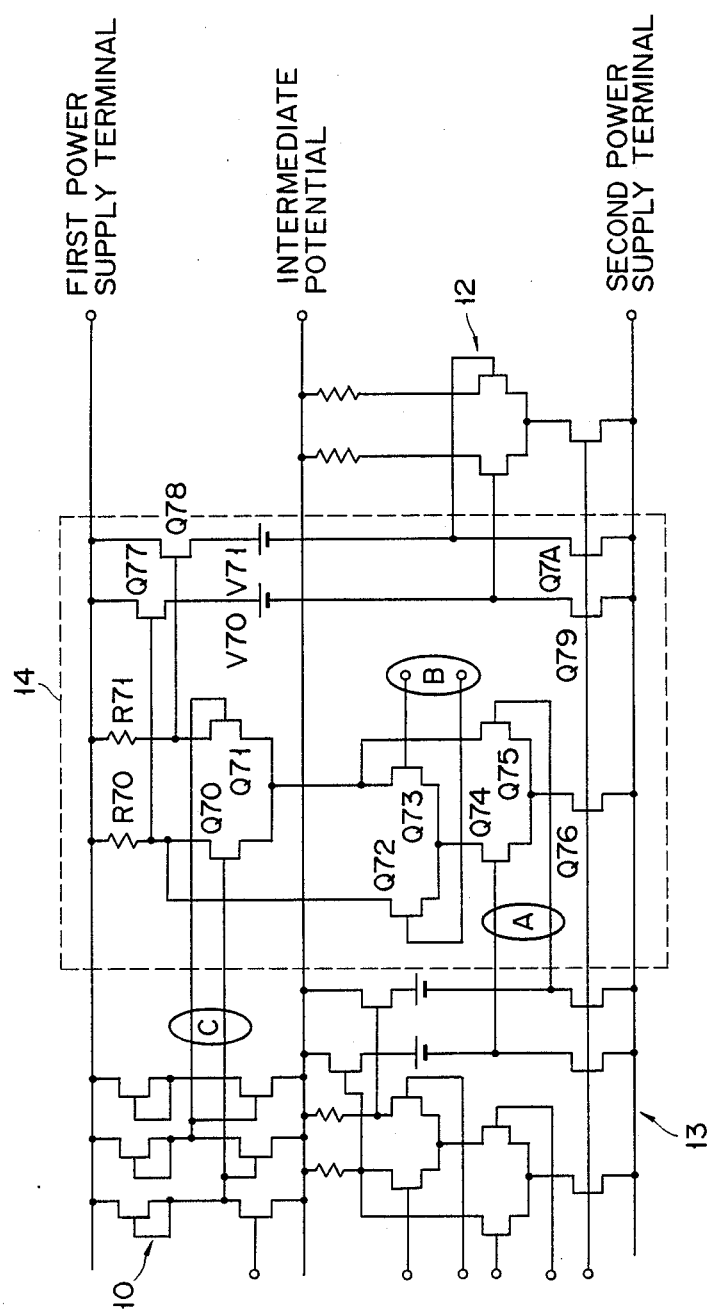
FIGS. 10 and 11 show circuit diagrams of signal transfer circuits serving as both signal transfer and logic processing circuits, each transfer circuit being made up of three floors of SCFL circuits.

In the embodiment shown in FIG. 10, the upper and lower floor correspond to DCFL circuit 10 and SCFL circuit 12, respectively. Signal transfer circuit 14 comprises Schottky barrier FET Q70, . . . , Q79, Q7A, resistors R70 and R71 and level shift means V70 and V71. The SCFL portions together made up of Q70, . . . , Q76, R70 and R71 are constituted by a three-stacked SCFL circuit provided across first and second power supply terminals.

The logical operation of the circuit is as follows:

A logic A and logic B in the lower floor SCFL are ANDed and the result and logic C in the upper floor DCFL circuit are NORed, the output of which is shifted down to SCFL circuit 12.

In general, the SCFL circuit, if its circuit portions are so stacked, allows a corresponding logical arrangement to be obtained readily in terms of the nature of the circuit. If in the embodiment the SCFL portions are increased in their stacking number, as required, to provide a circuit portion relative to the upper-order power source, it is not necessary to raise the level of the intermediate potential. As a result, it is possible to attain an effective logic circuit of a lower dissipation power.

Figure 11:
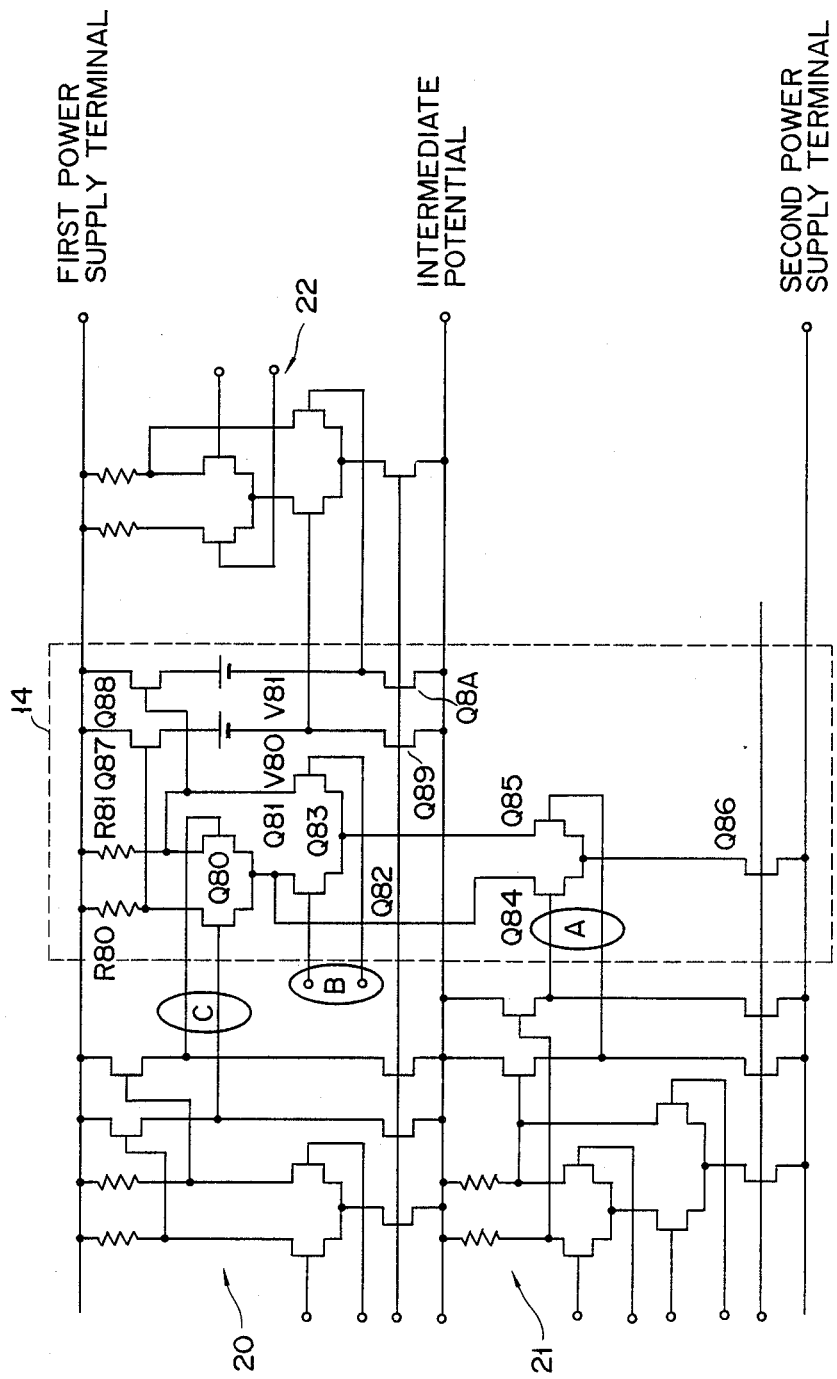

In the embodiment shown in FIG. 11, the upper and lower circuits correspond to double-stacked SCFL circuits 21 and 22, respectively. Across SCFL circuits 21 and 22 is connected signal transfer circuit 14 which performs a signal transfer and a logical processing. Signal transfer circuit 14 comprises a three-stacked SCFL circuit to which a power is supplied across first and second power supply terminals. Signal transfer circuit 14 comprises Schottky barrier FET Q80, . . . , Q89, Q8A, resistors R80 and R81, and level shift means V80, V81.

The logical operation of the signal transfer circuit 14 is as follows:

A logic A and logic B in the lower floor SCFL circuit 21 are ORed, the output of which is NANDed with a logic C of upper floor SCFL circuit 20. The NAND output is shifted to upper floor circuit 22. In the embodiment, such a three-stacked SCFL circuit is provided across first and second power supply terminals so as to obtain a highly efficient logical configuration.

Figure 12:
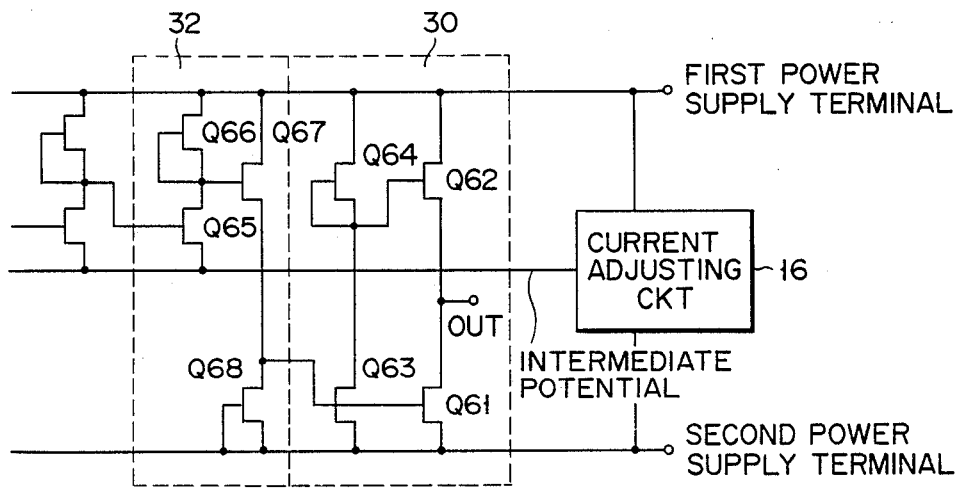
FIG. 12 shows a circuit diagram of an output circuit for generating a logic level above the operating potential of the DCFL or SCFL circuit.

A logic system is rarely constructed by only the logic circuits of the GaAs ICs, but it is generally constructed by the combination of the GaAs ICs and silicon ICs, such as TTL and CMOS. A specific example using the combination of the different types of ICs is shown in FIG. 12, and is a logic output circuit in which GaAs IC operating at a low voltage outputs a logic signal to a device operating at a high potential, such as a silicon device. In this instance, the upper floor circuit is of the DCFL type, and the lower floor circuit is of the DCFL or SCFL type. The logic signal of the upper floor DCFL circuit is amplified up to a difference potential between the potentials at the first and second power supply terminals. To be more specific, in FIG. 12, an output circuit 30 is indicated enclosed by a rectangular block of broken line. In the output circuit, Schottky barrier FETs Q61 and Q62 are connected in series between the first and second power supply terminals. A junction point between these FETs Q61 and Q62 constitutes a logic output terminal OUT. A pair of Schottky barrier FETs Q64 and Q63 serve as an inverter. This inverter generates a logic signal and transfers it to the gate of FET Q62 in the succeeding stage circuit. The logic output from the inverter is the inverse logic level of the logic input applied to the gate of FET Q61. Logic inputs to the gates of FETs Q63 and Q61 are in phase, and come from an interface circuit 32. The interface circuit is made up of a unit logic circuit of the direct coupling type including Schottky barrier FETs Q65 and Q66, another unit logic circuit including Schottky barrier FETs Q67 and Q68, with FET Q67 having the source follower connection with relation to FET Q68 as a load element. If necessary, a level shift means may be inserted between the source of FET Q67 and the drain of FET Q68.

The gate of FET Q65 in the interface circuit 32 is coupled for reception with the logic output of the upper floor DCFL circuit. The output logic is level shifted into the drain potential of load element Q68, through FETs Q65 and Q67. The level shifted signal is applied to the gates of FETs 63 and 61, thereby to drive FETs Q61 and 62 for output. By the inverter including FETs Q63 and Q64, the logic input to the gate of FET Q62 becomes the inverse logic level of that at the gate of FET Q61. Therefore, when FET Q61 is turned on, FET Q62 is turned off, and vice versa. In this way, the potential at the logic output OUT is swung from the potential at the first power supply terminal to that at the second one.

As described above, the currents consumed by he upper and lower floor circuits of DCFL and SCFL are invariable irrespective of the logic states of the logic circuit. Therefore, with the cascade connection of these circuit stages, a stable intermediate potential can be obtained by a simple current adjusting means for merely a differential current between the currents by the lower and upper floors.

Figure 13:
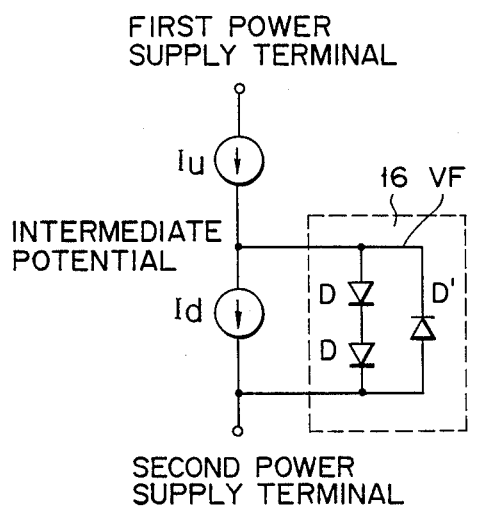
FIGS. 13 and 14 show circuit diagrams of current adjusting circuits using diodes.
Figure 14:
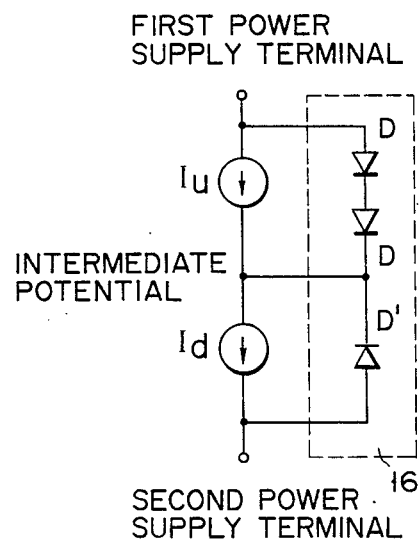

FIGS. 13 and 14 show arrangements of simple current adjusting circuits. The current adjusting circuit shown in FIG. 13 is used when the current Iu of the upper floor is larger than that Id of the lower floor, and is enclosed by a square block of broken line. A necessary number of diodes D are connected in series across the lower floor. A forward voltage $V_F$ across the diode group is stable and applied as an intermediate voltage across the lower floor. In this circuit, the different current between current Iu and Id flows through diode D to stabilize the intermediate potential. Diode D' connected is reversed with respective to the diode D. Diode D' serves as a bypass capacitor for removing the noise contained in the intermediate potential.

The current adjusting circuit of FIG. 14 is used when the upper floor current Iu is smaller than the lower floor current Id. In this instance, a series of diodes D for providing a stable potential for the intermediate potential is connected across the upper floor. The bypass diode D' is connected across the lower stage. In this instance, the intermediate potential is the difference between the first power supply terminal potential and the forward voltage drop across the diode D group.

It is suggestible that the current adjusting circuit is connected to the key circuit section. The noise removal diode D' may be replaced by a capacitor. This capacitor may be assembled into the integrated circuit per se, or externally connected to the integrated circuit.

FIG. 15 shows yet another current adjusting circuit. This circuit is used when the upper floor current Iu is smaller than the lower floor current Id, and is enclosed by a block 16. Schottky barrier diode Q71 is source follower connected to the intermediate potential point. The current difference between the upper and lower floor is supplied to the lower flower through the source of FET Q71. The gate of FET Q71 is connected to the anode side of a series circuit including diodes D. As a matter of course, the number of diodes must be enough to provide the reference potential for inter mediate potential. Schottky barrier FET Q72 as a current source feeds a minute to the diode series circuit. The sum of the voltage drops of those diodes, which is stable, is applied to the gate of FET Q71. Therefore, the intermediate potential applied from the source of FET Q71 is the difference between the reference voltage drop across the diode series circuit and the voltage across the gate-source path of FET Q71. To obtain a sufficient current capacity of FET Q71, it is only needed that the gate width of FET Q71 is equal to the difference between the total gate width of Schottky barrier FETs making up the lower floor and that of those FETs making up the upper floor. It is preferable that the FET Q71 and the constant current source FET in the circuit using the intermediate potential are fabricated by the same fabricating process. For example, those elements are fabricated on the same wafer by the same process. The resultant elements have the same variances in the threshold values, for example. In the circuit using such elements, a variation in the current flowing through the intermediate point is cancelled out by a variation in the current capability of the source follower connected FET Q71. The result is to provide a stable intermediate potential. In this current adjusting circuit, the noise removal is made by capacitor C connected between the source of FET Q71 and the second power supply terminal.

It is noted that the above current adjusting circuit uses the source follower FET Q71, and hence it serves as an extremely stable low voltage circuit. This circuit is preferably used with the key circuit.

Some examples of circuits for generating a reference potential for the current adjusting circuit 16 are illustrated in FIGS. 16A to 16C. In the case of FIG. 16A, resistor R provides 0.3 V voltage drop, and diode D 0.7 V forward voltage drop. A total of 1 V voltage drop or reference potential is formed. Capacitor C connected across the series circuit of resistor R and diode D bypasses noise and transient current which may be contained in the reference potential. The circuit of FIG. 16B uses a single resistor R for forming the reference potential, and noise removal capacitor C connected across the resistor R. Since the current fed to resistor R is fed from a constant current source of Schottky barrier FET, the voltage across the resistor is stable. The circuit of FIG. 16C is featured in that the forward junction capacitance of series connected diodes D' is utilized for the noise removal. In this case, the number of diodes D' is larger than that of series connected diodes D for providing the reference potential. If those diodes D' are connected in series, the diode function of the diodes is suppressed, while the capacitive function of them is distinguished.

It is evident that a proper combination of the reference voltage forming circuits of FIGS. 16A to 16C may be used, if necessary.

FIG. 17 shows a logic circuit containing three floors of the circuits constructed with Schottky barrier FETs. It is assumed that the currents consumed by the respective floors are related in the following way; $I1 < I2 < I3$, $I3 = I2 + I2'$, and $I2 = I1 + I1'$. The power supply voltage for the upper floor is determined by a voltage drop across a series circuit made up of diodes D91 and D92. The power supply voltage for the lower floor is determined by the different potential between the voltage drop across a series circuit made up of diodes D93 and D94 and the voltage across the gate-source path of Schottky barrier FET Q41. The power supply voltage for the medium floor is equal to the difference potential as obtained by subtracting the sum of the power supply voltages for the upper and lower floors from the potential difference between the potentials of the first and second power supply terminals.

Figure 18:
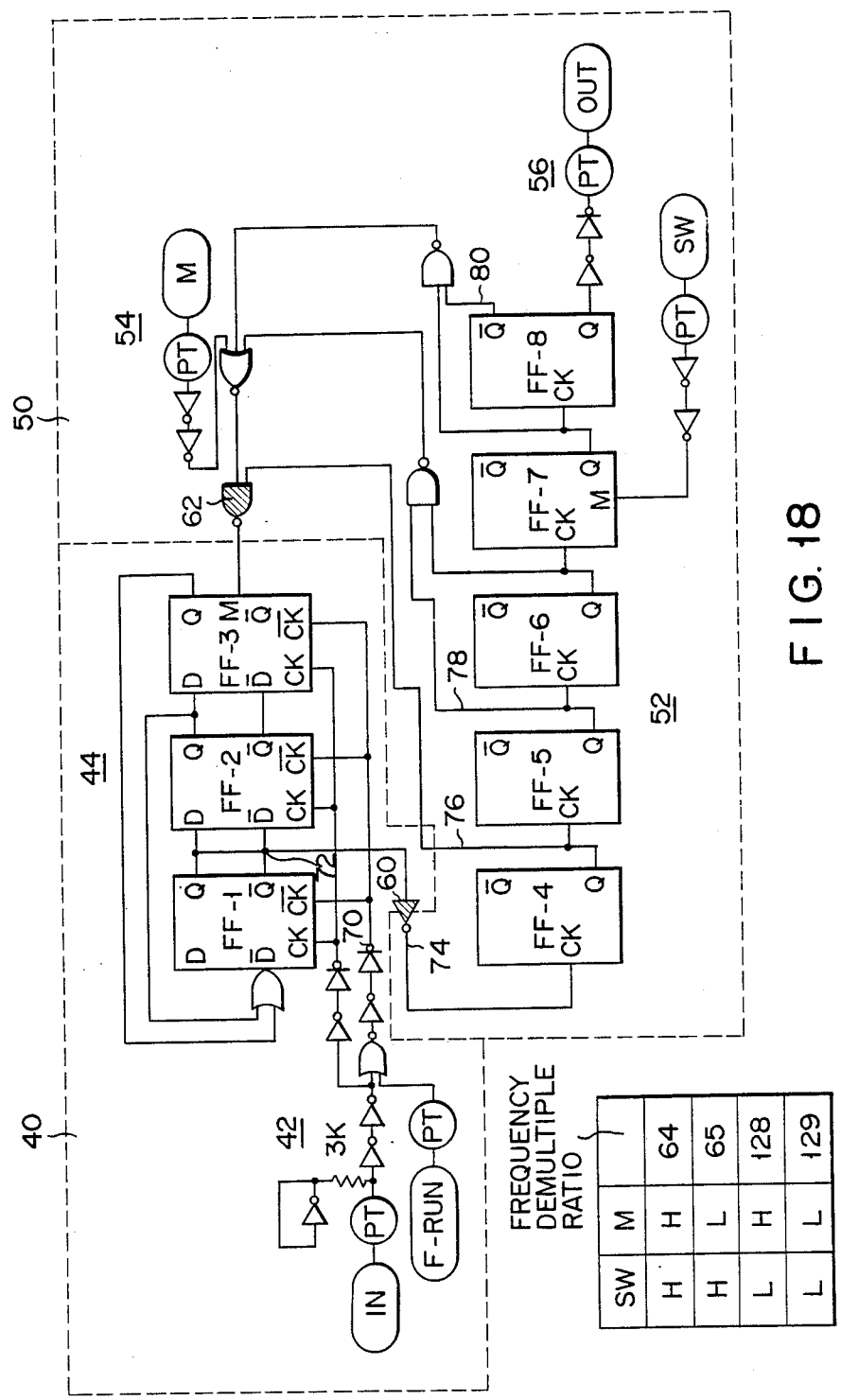
FIG. 18 shows a circuit diagram of a variable frequency demultiplier IC incorporating this invention.

FIG. 18 shows a variable frequency demultiplier IC used for a synthesizer section of a mobile telecommunication unit such as a portable telephone set. This type of the device is generally driven by a battery. Designers are always under continuous pressures to reduce the power dissipation by the device.

The variable frequency demultiplier IC must operate at 1 GHz. This impels designers to use ECL for the elements of the conventional frequency demultiplier. Recently, the GaAs IC has attracted attentions because its low power dissipation. The frequency demultiplier of FIG. 18 is a 128/129 or 64/65 frequency demultiplier of the variable type, which is constructed by using DCFL circuits including GaAs Schottky barrier FETs. The logic circuit according to this invention is incorporated into the frequency demultiplier.

In FIG. 18, FF-1 to FF-8 are flip-flops for executing the ½ frequency division. The lower floor circuit 40 is made up of input circuit 42 and variable frequency demultiplier 44 for obtaining a frequency a factor of four or five that of the input signal. The demultiplier consists of three master-slave type flip-flops FF-1 to FF-3. The variable frequency demultiplier 44 operates at a high speed, and hence it is contained in the lower floor circuit 40 with stable ground potential.

The upper floor circuit 50 is comprised of extension section 52 including flip-flops FF-4 to FF-8, feedback circuit 54, and output circuit 56. Extension section 52 further divides, by 32, the frequency of the output signal from variable frequency divider 44. This section 52 may operate at a low speed. Therefore, the edge-trigger type flip-flops are used for FF-4 to FF-8.

Hatched circuit 60 is the FIG. 6 signal transfer circuit for transferring the signal from the lower floor circuit 40 to the upper floor circuit 50. Another hatched circuit 62 is the FIG. 7 signal transfer circuit for transferring the signal from the upper floor circuit 50 to the lower floor circuit 40.

Figure 19:
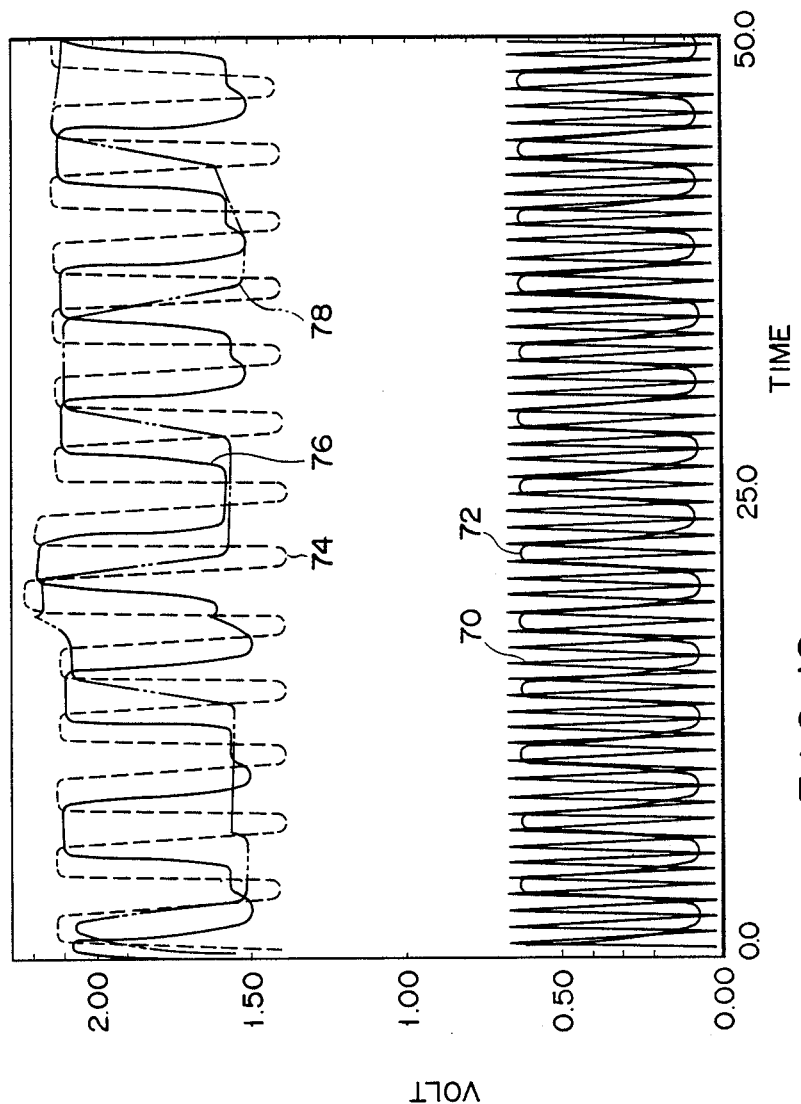
FIG. 19 shows waveforms useful in explaining the operation of the FIG. 18 frequency demultiplier.

FIG. 19 shows waveforms at the key portions in the FIG. 18 frequency demultiplier, which are depicted by simulating the operation of the demultiplier. Reference numeral 25 designates a waveform of a clock signal for flip-flops FF-1 to FF-3. A waveform designated by 72 is that of the $\overline{Q}$ output of flip-flop FF-1, and is ½ the frequency of the clock signal. A waveform 74 is that of the signal after passed through signal transfer circuit 60. As seen, the potential of the signal of the waveform 74 is raised approximately 1.4 V above the $\overline{Q}$ output 72. The output of flip-flop FF-4 has a wave-form 76, and a frequency ½ that of the output 74 of the signal transfer circuit 60. A waveform 78 is that of the output flip-flop FF-5. The output of flip-flop FF-8 has a waveform 80. In this instance, 1/64 frequency demultiplication is employed. A frequency of the FF-8 output is 1/64 the clock signal frequency 70.

While 70 mA is needed for the conventional frequency demultiplier IC of this type, only 4 mA is consumed by the frequency demultiplier of FIG. 18. The required current is remarkably reduced.

FIG. 20 shows an additional embodiment of a logic circuit according to this invention. While the embodiments as mentioned above use signal transfer circuits 14 between the upper and lower floors, it is not essential to the logic circuit, because this invention is applicable for the case that the upper and lower floors operate independently, for logic processing, with an intention of lowering the power dissipation of the overall system. In this logic circuit, only current adjusting means 16 is provided, in addition to the upper and lower floor circuits. The current adjusting means 16 corrects a varied differential current between the upper and lower floor currents, to stabilize the intermediate potential.

While this invention has been described using specific embodiments, it should be understood that this invention may variously be modified and changed within the scope of this invention.

What is claimed is:

1. A logic circuit using Schottky barrier FETs comprising:
   a plurality of DCFL circuits connected in series between first and second power supply terminals, said each DCFL circuits containing a switching element and a load element, said elements consisting of Schottky barrier FETs and connected in a direct fashion; and
   a potential stabilizing means for stabilizing a potential at the junction point between said adjacent DCFL circuits, by supplementally feeding the differential current between the current consumed by said adjacent DCFL circuits.

2. A logic circuit according to claim 1, further comprising a transmitting means for transferring a logic signal from one of said DCFL circuits to another.

3. A logic circuit according to claim 1, in which said stabilizing means includes
   a circuit for generating a reference potential; and
   a Schottky barrier FET coupled at the gate with said reference potential, and outputting as a source follower fashion, said FET being fabricated by the same process as that of the load Schottky barrier FET of the DCFL circuit utilizing the potential at said junction point.

4. A logic circuit according to claim 1, further comprising an output circuit made up of two Schottky barrier FETs connected in series between said first and second power supply terminals, the gates of said two FETs receiving logic signals one having the inverse logic of the other, the junction point of said two FETs providing a logic signal amounting to the potential difference between said first and second power supply terminals.

5. A logic circuit using Schottky barrier FETs comprising:
   at least one DCFL circuit containing a switching element and a load element, both elements being connected in a direct fashion;
   at least one SCFL circuit being a unit logic containing Schottky barrier FETs connected in a differential manner, said DCFL and SCFL circuits being connected in series between first and second power supply terminals; and
   a potential stabilizing means for stabilizing a potential at the junction point between said adjacent DCFL and SCFL circuits, by supplementally feeding the differential current between the current consumed by said adjacent DCFL and SCFL circuits.

6. A logic circuit according to claim 5, further comprising a transmitting means for transferring a logic signal from one of said DCFL and SCFL circuits to another.

7. A logic circuit according to claim 5, in which said stabilizing means includes
   a circuit for generating a reference potential; and a Schottky barrier FET coupled at the gate with said reference potential, and outputting as a source follower fashion, said FET being fabricated by the same process as that of the current source Schottky barrier FET of the circuit utilizing the potential at said junction point, said junction point potential utilizing circuit being one of said DCFL and SCFL circuits.

8. A logic circuit according to claim 5, further comprising an output circuit made up of two Schottky barrier FETs connected in series between said first and second power supply terminals, the gates of said two FETs receiving logic signals one having the inverse logic of the other, the junction point of said two FETs providing a logic signal amounting to the potential difference between said first and second power supply terminals.

9. A logic circuit using Schottky barrier FETs comprising:
- a plurality of SCFL circuits connected in series between first and second power supply terminals, said SCFL circuits being each a unit logic containing Schottky barrier FETs connected in a differential fashion; and
- a potential stabilizing means for stabilizing a potential at the junction point between said adjacent SCFL circuits, by supplementally feeding the differential current between the current consumed by said adjacent SCFL circuits.

10. A logic circuit according to claim 9, further comprising a transmitting means for transferring a logic signal from one of said SCFL circuits to another.

11. A logic circuit according to claim 9, in which said stabilizing means includes
- a circuit for generating a reference potential; and
- a Schottky barrier FET coupled at the gate with said reference potential, and outputting as a source follower fashion, said FET being fabricated by the same process as that of the current source Schottky barrier FET of the SCFL circuit utilizing the potential at said junction point.

12. A logic circuit according to claim 9, further comprising an output circuit made up of two Schottky barrier FETs connected in series between said first and second power supply terminals, the gates of said two FETs receiving logic signals one having the inverse logic of the other, the junction point of said two FETs providing a logic signal amounting to the potential difference between said first and second power supply terminals.

* * * * *